(12) United States Patent
Nomiyama et al.

(10) Patent No.: US 10,861,759 B2
(45) Date of Patent: Dec. 8, 2020

(54) CIRCUIT MODULE

(71) Applicant: Murata Manufacturing Co., Ltd., Kyoto (JP)

(72) Inventors: Kaneo Nomiyama, Kyoto (JP); Kazushige Sato, Kyoto (JP); Yuya Eshita, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/374,022

(22) Filed: Apr. 3, 2019

(65) Prior Publication Data

US 2019/0229027 A1    Jul. 25, 2019

Related U.S. Application Data

(63) Continuation of application No. PCT/JP2017/036964, filed on Oct. 12, 2017.

(30) Foreign Application Priority Data

Oct. 25, 2016  (JP) .................................. 2016-208266

(51) Int. Cl.
    *H01L 23/02*  (2006.01)
    *H01L 23/31*  (2006.01)
    (Continued)

(52) U.S. Cl.
    CPC ........ *H01L 23/3114* (2013.01); *H01F 27/022* (2013.01); *H01F 27/2804* (2013.01);
    (Continued)

(58) Field of Classification Search
    CPC ..... H01L 21/56; H01L 23/00; H01L 23/3114; H01L 23/3135; H01L 25/00
    (Continued)

(56) References Cited

U.S. PATENT DOCUMENTS 7,011,988 B2 * 3/2006 Forcier ................. B81C 1/0023
                                                257/E21.514
7,684,207 B2 * 3/2010 Noda ................. H01L 23/49822
                                                361/795
(Continued)

FOREIGN PATENT DOCUMENTS

JP    2002-151801 A    5/2002
JP    2005-109467 A    4/2005
(Continued)

OTHER PUBLICATIONS

International Search Report for International Application No. PCT/JP2017/036964.
(Continued)

*Primary Examiner* — Luan C Thai
(74) *Attorney, Agent, or Firm* — Pearne & Gordon LLP

(57) ABSTRACT

A circuit module includes: a substrate including a wiring pattern; a first region in which a first electronic component is mounted on one major surface of the substrate; a second region in which a second electronic component, which is taller than the first electronic component, is mainly mounted on the one major surface of the substrate; a first conductor provided in the first region and electrically connected with the wiring pattern; and sealing resin that seals the first electronic component, the second electronic component, and the first conductor. Sealing resin sealing the first region is formed to be shorter than sealing resin sealing the second region, part of the first conductor is exposed on a surface of the sealing resin, wiring is formed on the surface of the sealing resin, and the first conductor the part of which is exposed is electrically connected with the wiring.

19 Claims, 7 Drawing Sheets

(51) Int. Cl.
   *H01F 27/28* (2006.01)
   *H01G 4/30* (2006.01)
   *H01G 2/10* (2006.01)
   *H01F 27/02* (2006.01)
   *H01L 23/00* (2006.01)
   *H05K 1/18* (2006.01)
   *H01L 25/00* (2006.01)
   *H05K 3/28* (2006.01)
   *H01L 21/56* (2006.01)
   *H05K 1/02* (2006.01)

(52) U.S. Cl.
   CPC ............... *H01G 2/103* (2013.01); *H01G 4/30* (2013.01); *H01L 21/56* (2013.01); *H01L 23/00* (2013.01); *H01L 23/3121* (2013.01); *H01L 23/3135* (2013.01); *H01L 25/00* (2013.01); *H05K 1/02* (2013.01); *H05K 1/18* (2013.01); *H05K 3/28* (2013.01)

(58) Field of Classification Search
   USPC ........................................................ 257/678
   See application file for complete search history.

(56) References Cited

U.S. PATENT DOCUMENTS 8,315,060 B2 * 11/2012 Morikita .............. H05K 1/0218
   361/748
2006/0043606 A1    3/2006  Imaoka et al.
2006/0286301 A1   12/2006  Murata et al.
2011/0013349 A1    1/2011  Morikita et al.

FOREIGN PATENT DOCUMENTS

| JP | 2006-73702 A1 | 3/2006 |
| JP | 2006-74587 A | 3/2006 |
| JP | 2006-222126 A | 8/2006 |
| JP | 2009-188144 A | 8/2009 |
| JP | 5889615 B2 | 3/2016 |
| WO | 2009/122835 A1 | 10/2009 |
| WO | 2014/178153 A1 | 11/2014 |

OTHER PUBLICATIONS

Written Opinion for International Application No. PCT/JP2017/036964.

* cited by examiner

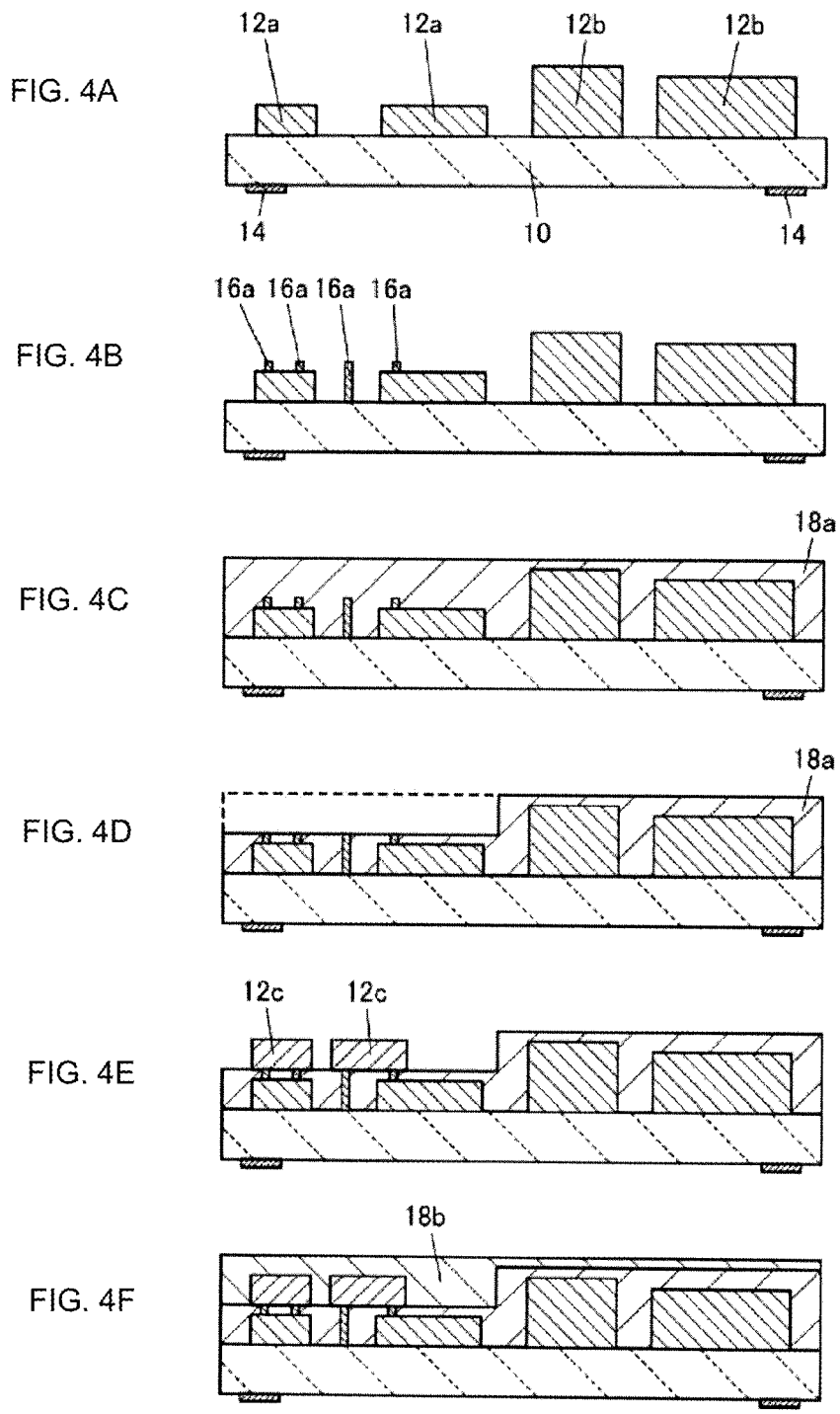

CIRCUIT MODULE

This is a continuation of International Application No. PCT/JP2017/036964 filed on Oct. 12, 2017 which claims priority from Japanese Patent Application No. 2016-208266 filed on Oct. 25, 2016. The contents of these applications are incorporated herein by reference in their entireties.

BACKGROUND OF THE DISCLOSURE

Field of the Disclosure

The present disclosure relates to a circuit module in which a plurality of electronic components are mounted on a substrate and sealed with resin.

Description of the Related Art

A circuit module in which a plurality of electronic components constituting an electronic circuit are mounted on a substrate in an integrated manner has been known. However, electronic components having mutually different heights are disposed in a mixed manner and sealed with a resin such that the height is adjusted to the height of the higher electronic components in general in a circuit module of the related art (see FIG. 8).

FIG. 8 is a sectional view illustrating a circuit module of the related art. As illustrated in FIG. 8, a circuit module 400 includes a substrate 410, electronic components 420a, electronic components 420b, and sealing resin 430. The electronic components 420a are shorter than the electronic components 420b in height. The electronic components 420a and the electronic components 420b are mounted on the substrate 410 and are electrically connected with a wiring pattern (not shown) provided in or on the substrate 410. The sealing resin 430 seals the electronic components 420a and the electronic components 420b such that the height is adjusted to the height of the electronic components 420b (see Patent Document 1, for example).

Patent Document 1: Japanese Unexamined Patent Application Publication No. 2006-74587

BRIEF SUMMARY OF THE DISCLOSURE

Compared to the thickness of a resin sealing the electronic components 420b, however, the sealing resin 430 above the electronic components 420a is formed thicker than the thickness required for sealing. Thus, there is an unnecessary resin above the electronic components 420a. As a result, there has been a problem in that the circuit module 400 includes a region which is not effectively utilized.

The present disclosure is made in consideration of the above-described problem and aims at providing a circuit module that is capable of utilizing a region, which is not effectively utilized, in the sealing resin and thus improving volumetric efficiency.

A circuit module according to the present disclosure includes: a substrate provided with a wiring pattern; a first region in which a first electronic component is mounted on one major surface of the substrate; a second region in which a second electronic component, which is taller than the first electronic component in height, is mainly mounted on the one major surface of the substrate; a first conductor that is provided in the first region and electrically connected with the wiring pattern; and sealing resin that seals the first electronic component, the second electronic component, and the first conductor. The sealing resin sealing the first region is formed to be shorter than the sealing resin sealing the second region in height, part of the first conductor is exposed on a surface of the sealing resin sealing the first region, wiring is formed on the surface of the sealing resin sealing the first region, and the part of the first conductor that is exposed is electrically connected with the wiring on the surface of the sealing resin.

The sealing resin sealing the first region is formed to be shorter than the sealing resin sealing the second region in height. Accordingly, wiring is formed on the surface of the sealing resin in the first region sealing the first electronic component, which is shorter, and volumetric efficiency of the circuit module can be improved by utilizing a region which cannot be effectively utilized when the whole of electronic components is sealed with the sealing resin such that height is adjusted to a taller electronic component, for example.

In the circuit module according to the present disclosure, a third electronic component may be mounted on the surface of the sealing resin sealing the first region and the third electronic component may be electrically connected with the first conductor the part of which is exposed.

The third electronic component can be mounted in a region which cannot be effectively utilized when the whole of electronic components is sealed with the sealing resin such that height is adjusted to a taller electronic component, for example, and thus, the volumetric efficiency of the circuit module can be further improved in the present disclosure.

In the circuit module according to the present disclosure, at least one conductor of the first conductor may be formed on an electrode of the first electronic component.

The first conductor can be formed in a region which cannot be effectively utilized when the whole of electronic components is sealed with the sealing resin such that the height is adjusted to a taller electronic component, for example, and thus, the volumetric efficiency of the circuit module can be further improved in the present disclosure.

The circuit module according to the present disclosure may further include additional sealing resin that seals the wiring on the surface of the sealing resin and the third electronic component.

In the circuit module according to the present disclosure, the additional sealing resin may also seal a surface of the sealing resin sealing the second region.

In the circuit module according to the present disclosure, a conductive film electrically connected with a ground potential of the substrate may be formed on side surfaces of the substrate, the sealing resin, and the additional sealing resin and a surface of the additional sealing resin or the surfaces of the sealing resin and the additional sealing resin.

A second conductor may be further formed on an electrode of the third electronic component or on the wiring on the surface of the sealing resin, the second conductor may be sealed with the additional sealing resin, part of the second conductor may be exposed on the surface of the additional sealing resin, and the second conductor the part of which is exposed may be electrically connected with the conductive film.

The first conductor may be sintered metal in a columnar shape.

The first conductor or the second conductor may be sintered metal in a columnar shape.

According to the present disclosure, the volumetric efficiency of the circuit module can be improved.

BRIEF DESCRIPTION OF THE SEVERAL VIEWS OF THE DRAWINGS

FIGS. 4A to 4F illustrate a manufacturing process of the circuit module according to the second embodiment.

DETAILED DESCRIPTION OF THE DISCLOSURE

Figure 1A:
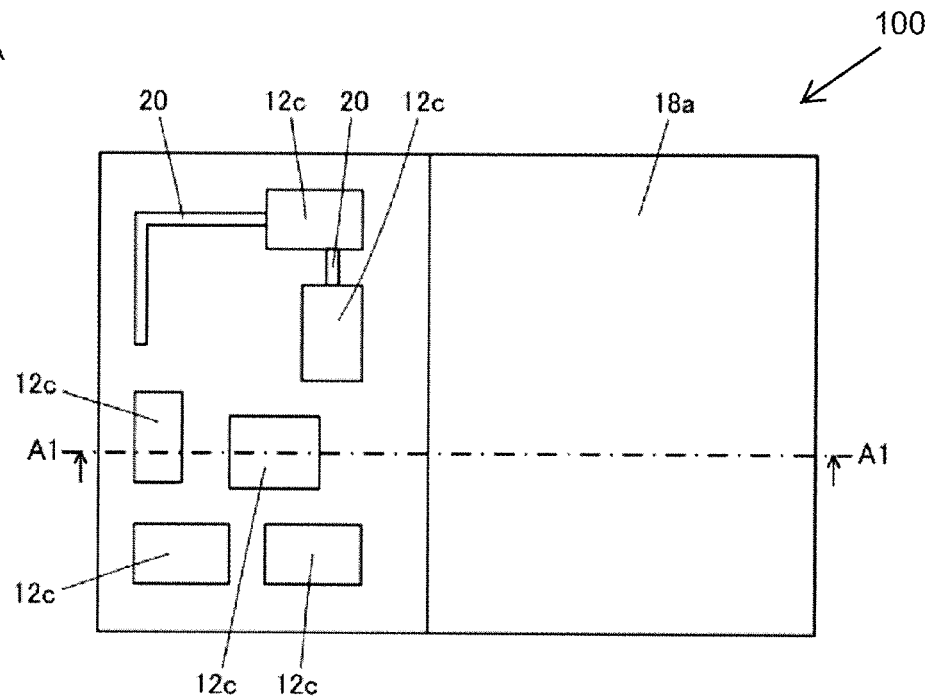
FIG. 1A is a top view illustrating a circuit module according to a first embodiment and FIG. 1B is an end view taken along A1-A1 of FIG. 1A.

A circuit module according to the present disclosure is described below with reference to the accompanying drawings. In the following description, identical components and components mutually having identical functions are denoted by the identical reference characters and duplicate description thereof is omitted.

First Embodiment

Figure 1B:
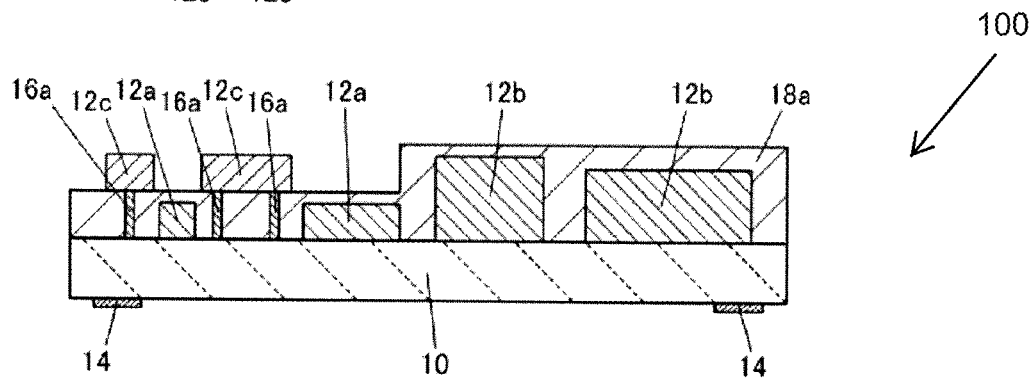

The configuration of a circuit module 100 which is a first embodiment of the circuit module according to the present disclosure is described with reference to FIGS. 1A and 1B and FIGS. 2A to 2E. FIG. 1A is a top view illustrating the circuit module 100 which is the first embodiment of the circuit module according to the present disclosure and FIG. 1B is an end view taken along A1-A1 of FIG. 1A. FIGS. 2A to 2E illustrate a manufacturing process of the circuit module 100 which is the first embodiment of the circuit module according to the present disclosure.

Figure 2A:
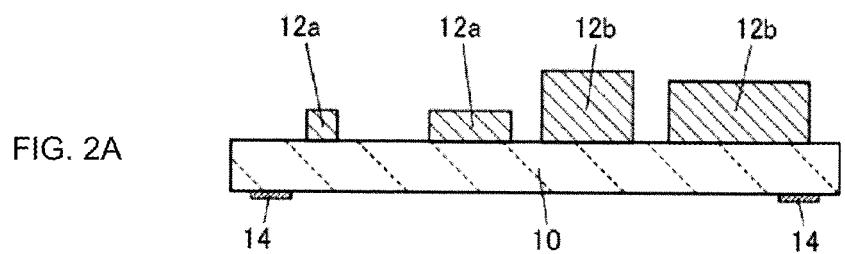
FIGS. 2A to 2E illustrate a manufacturing process of the circuit module according to the first embodiment.

A substrate 10 is first prepared. The substrate 10 is provided with a wiring pattern (not shown) on one major surface thereof and includes internal wiring (not shown) thereinside. The wiring pattern is connected with external terminals 14 formed on the other major surface of the substrate 10 with the internal wiring of the substrate 10 interposed therebetween. Examples of the substrate 10 include a wiring substrate and a component incorporating substrate in which an electronic component is embedded, but the substrate 10 is not limited to these examples. Subsequently, electronic components 12a (the first electronic components) and electronic components 12b (the second electronic components) that are taller than the electronic components 12a in height are mounted on the one major surface of the substrate 10 (FIG. 2A).

A region in which the electronic components 12a are mounted is the first region in this description and a region in which the electronic components 12b are mounted is the second region in this description. The number of each of the first region and the second region is not limited to one, but a plurality of first regions and second regions may be defined.

Examples of the electronic components 12a include a chip resistance, a chip multilayer capacitor, and a film-type inductor, but the electronic components 12a are not limited to these examples. Further, all the electronic components 12a are not necessarily electronic components of the same kind. That is, the electronic components 12a may be electronic components of mutually different kinds. Examples of the electronic components 12b include a winding inductor and a package IC, but the electronic components 12b are not limited to these examples. Further, all the electronic components 12b are not necessarily electronic components of the same kind. That is, the electronic components 12b may be electronic components of mutually different kinds.

Figure 2B:
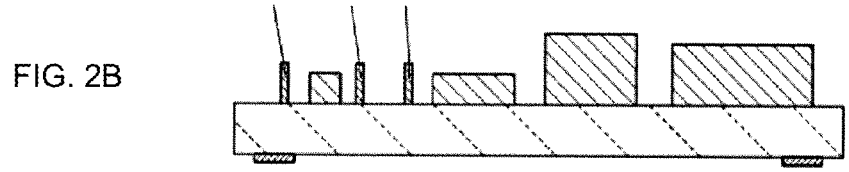

Subsequently, posts 16a (the first conductors) are formed on the wiring pattern in the first region and are electrically connected with the wiring pattern (FIG. 2B). The posts 16a are taller than the electronic components 12a in height. The posts 16a have a columnar metal body. The posts 16a may be conductive posts obtained by laminating metal nano paste, which can be fired at low temperature, in a columnar shape and sintering the laminated paste. The posts 16a and the wiring pattern are fixed and connected to each other by metal bonding. Compared to, for example, the case where resins in which via holes are formed are bonded to each other or the case where via holes are formed after performing resin sealing, the case where the posts 16a are conductive posts obtained by laminating metal nano paste, which can be fired at low temperature, in a columnar shape and sintering the laminated paste does not require a positioning margin for forming via holes, enabling the connection in a small area.

Examples of the metal nano paste which can be fired at low temperature include silver nano paste, but the metal nano paste is not limited to silver nano paste. Further, in this description, the "columnar shape" includes any columnar shape such as a cylindrical shape, a substantially cylindrical shape, an elliptic cylindrical shape, and a polygonal cylindrical shape. Further, the "columnar shape" includes not only a shape of which a top surface and a bottom surface mutually have the same dimensions, but also includes a shape of which a bottom surface is smaller or larger than a top surface, thus including a gradually tapered shape and a gradually reversed tapered shape.

Figure 2C:
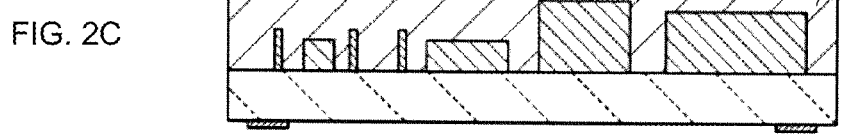

Next, after the electronic components 12a, the electronic components 12b, and the posts 16a are sealed with sealing resin 18a, the whole is polished in accordance with the height of the electronic components 12b (FIG. 2C).

Figure 2D:
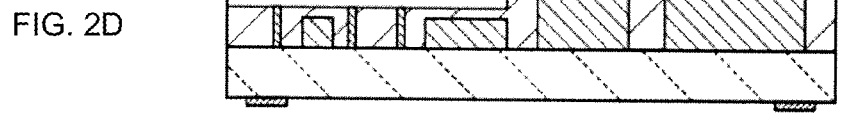

Then, the sealing resin 18a sealing the first region is polished so that the sealing resin 18a sealing the first region becomes shorter than the sealing resin 18a sealing the second region in height and thus the end faces of the posts 16a are exposed. Subsequently, wiring 20 is formed on the surface of the sealing resin 18a sealing the first region and the posts 16a are electrically connected with the wiring 20 (FIG. 2D). That is, the wiring 20 can be added to a region which cannot be effectively utilized unless the sealing resin 18a sealing the first region is polished so that the sealing resin 18a sealing the first region becomes shorter in height than the sealing resin 18a sealing the second region, improving the volumetric efficiency of the circuit module. Further, even though, for example, wiring density is increased and flexibility in wiring is lowered in the wiring pattern, the wiring 20 can be added, being able to enhance the flexibility in wiring. Since the wiring 20 is not formed on the surface of the sealing resin 18a sealing the second region, but is formed on the surface of the sealing resin 18a sealing the first region, which is polished to be shorter than the sealing resin 18a sealing the second region in height, the thickness of the circuit module 100 is not increased even with the wiring 20 formed.

The wiring 20 is formed, for example, by applying a silver nano paste and sintering the paste, but the wiring 20 is not limited to this. Here, the wiring 20 includes a land. Further, at least a part of the wiring 20 may be used as a radiation electrode of an antenna, but the wiring 20 is not limited to this. Further, when the sealing resin 18a sealing the first region and serving as a dielectric layer of the wiring 20 is polished so that the sealing resin 18a sealing the first region becomes shorter than the sealing resin 18a sealing the second region in height, the impedance of the wiring 20 may be adjusted by adjusting the thickness.

Figure 2E:
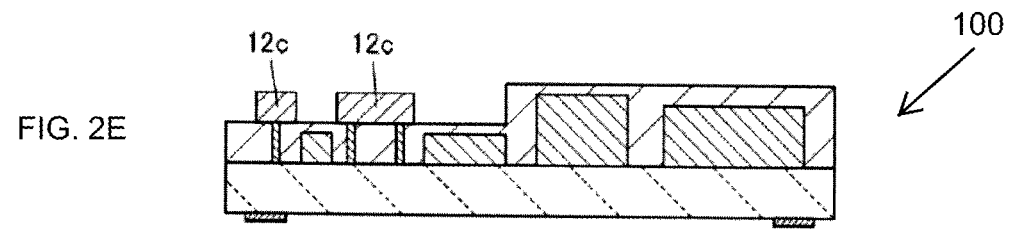

Next, electronic components 12c (the third electronic components) are mounted on the surface of the sealing resin 18a sealing the first region and the electronic components 12c are electrically connected with the wiring 20 (FIGS. 1A and 1B and FIG. 2E). That is, the electronic components 12c can be further mounted on a region which cannot be effectively utilized unless, for example, the sealing resin 18a sealing the first region is polished so that the sealing resin 18a sealing the first region becomes shorter than the sealing resin 18a sealing the second region in height, further improving the volumetric efficiency of the circuit module. Here, the height, which is obtained by adding the height of the electronic components 12c to the height of the sealing resin 18a sealing the first region from one major surface of the substrate 10 is preferably set lower than the surface of the sealing resin 18a sealing the second region. Further, the electronic components 12c may be directly connected with the posts 16a. Although not illustrated, the deterioration caused by humidity and so forth may be prevented by applying resin coating to the electronic components 12c and the wiring 20 after mounting the electronic components 12c.

Examples of the electronic components 12c include a chip component constituting a matching circuit of an antenna, a chip inductor constituting a matching circuit and a filter circuit, a film-type inductor, and a multilayer component incorporating an inductor, but the electronic components 12c are not limited to these examples. Further, all the electronic components 12c are not necessarily electronic components of the same kind. That is, the electronic components 12c may be electronic components of mutually different kinds. When the electronic components constituting a matching circuit of an antenna are mounted as the electronic components 12c and the wiring 20, a part of which is a radiation electrode of the antenna, is formed on the surface of the sealing resin 18a sealing the first region, the matching circuit is easily adjusted. Further, when inductors such as a chip inductor, a film-type inductor, and a multilayer component incorporating an inductor are mounted as the electronic components 12c, the inductors are farther from a ground layer of the substrate 10 than in the case where the inductors are mounted as the electronic components 12a or the electronic components 12b, reducing a loss.

Second Embodiment

Figure 3A:
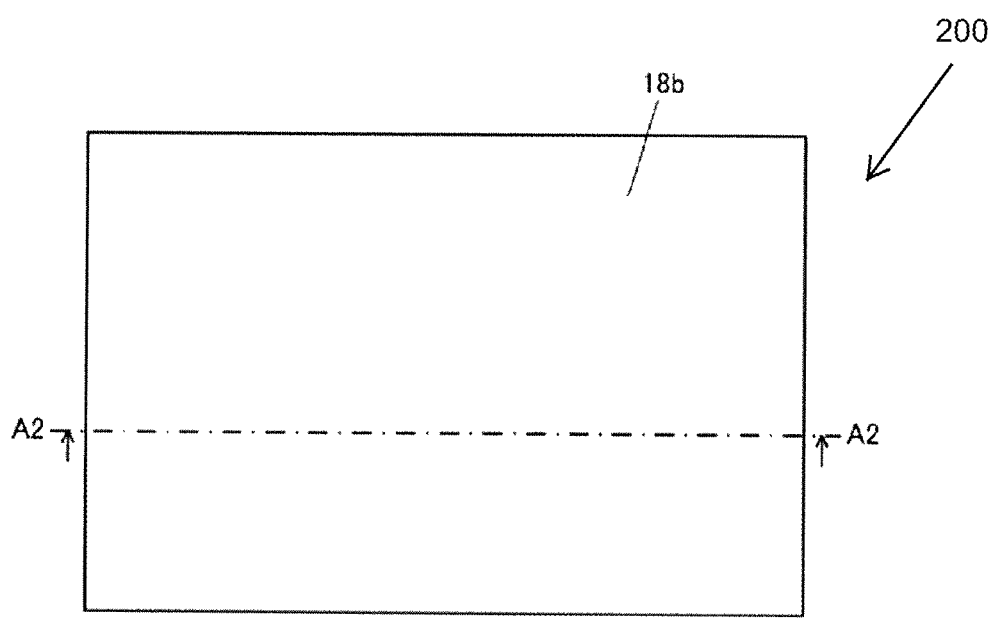
FIG. 3A is a top view illustrating a circuit module according to a second embodiment and FIG. 3B is an end view taken along A2-A2 of FIG. 3A.
Figure 3B:
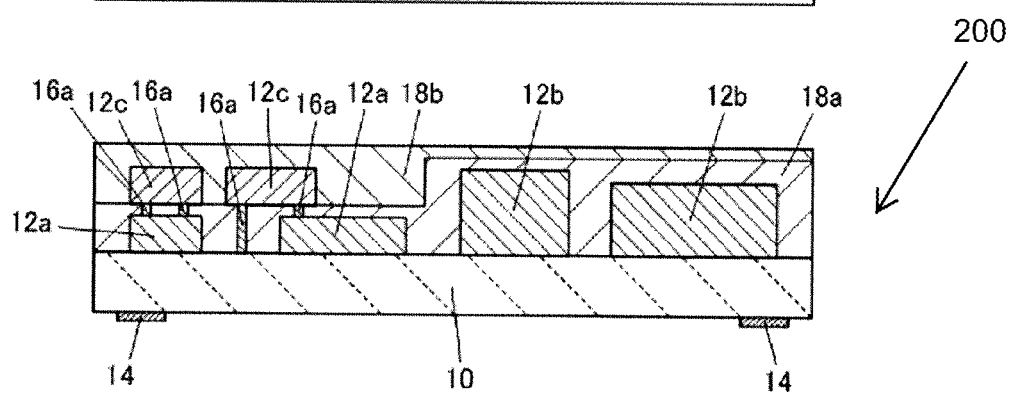

The configuration of a circuit module 200 which is a second embodiment of the circuit module according to the present disclosure is described with reference to FIGS. 3A and 3B and FIGS. 4A to 4F. FIG. 3A is a top view illustrating the circuit module 200 which is the second embodiment of the circuit module according to the present disclosure and FIG. 3B is an end view taken along A2-A2 of FIG. 3A. FIGS. 4A to 4F illustrate a manufacturing process of the circuit module 200 which is the second embodiment of the circuit module according to the present disclosure.

A substrate 10 is first prepared. The substrate 10 is provided with a wiring pattern (not shown) on one major surface thereof and includes internal wiring (not shown) thereinside. The wiring pattern is connected with external terminals 14 formed on the other major surface of the substrate 10 with the internal wiring of the substrate 10 interposed therebetween. Subsequently, the electronic components 12a and the electronic components 12b are mounted on the one major surface of the substrate 10 (FIG. 4A).

Subsequently, posts 16a are formed on the wiring pattern and electrodes of the electronic components 12a in the first region and electrically connected with the wiring pattern (FIG. 4B). The post 16a formed on the wiring pattern in the first region is taller than the electronic components 12a in height. The height obtained by adding the height of the post 16a formed on the electrode of the electronic component 12a to the height of the electronic component 12a is substantially the same as the height of the post 16a formed on the wiring pattern in the first region.

Next, after the electronic components 12a, the electronic components 12b, and the posts 16a are sealed with sealing resin 18a, the whole is polished in accordance with the height of the electronic components 12b (FIG. 4C).

Subsequently, the sealing resin 18a sealing the first region is polished so that the sealing resin 18a sealing the first region becomes shorter than the sealing resin 18a sealing the second region in height and thus end surfaces of the posts 16a are exposed. Subsequently, wiring 20 is formed on the surface of the sealing resin 18a sealing the first region and the posts 16a are electrically connected with the wiring 20 (FIG. 4D). That is, the posts 16a formed on the electrodes of the electronic components 12a are connected with the wiring 20 without interposition of the wiring pattern of the substrate 10. Thus, the posts 16a and the wiring 20 can be formed on a region which cannot be effectively utilized unless, for example, the sealing resin 18a sealing the first region is polished so that the sealing resin 18a sealing the first region becomes shorter than the sealing resin 18a sealing the second region in height, improving the volumetric efficiency of the circuit module.

Subsequently, the electronic components 12c are mounted on the surface of the sealing resin 18a sealing the first region and the electronic components 12c are electrically connected with the wiring 20 (FIG. 4E). The height obtained by including the height of the sealing resin 18a sealing the first region, the height of the wiring 20, and the height of the electronic component 12c is lower than the surface of the sealing resin 18a sealing the second region.

Next, after the electronic components 12c, the wiring 20, and the surface of the sealing resin 18a sealing the second region are sealed with the sealing resin 18b, the surface of the sealing resin 18b is polished (FIGS. 3A and 3B and FIG. 4F). That is, the electronic components 12c and the wiring 20 are sealed without being exposed and the surface of the sealing resin 18b is polished to be planarized. Accordingly, when the circuit module 200 is mounted on a substrate of an electronic device, the circuit module 200 is easily gripped, thus being easily mounted on the substrate of the electronic device.

Further, the electronic components 12c and the wiring 20 are not exposed, being able to avoid the mechanical and chemical actions. For example, tin corrosion cracks caused by moisture and dissimilar metal bonding are prevented. Here, the same material may be employed for the sealing resin 18a and the sealing resin 18b or different materials may be employed therefor.

Third Embodiment

Figure 5A:
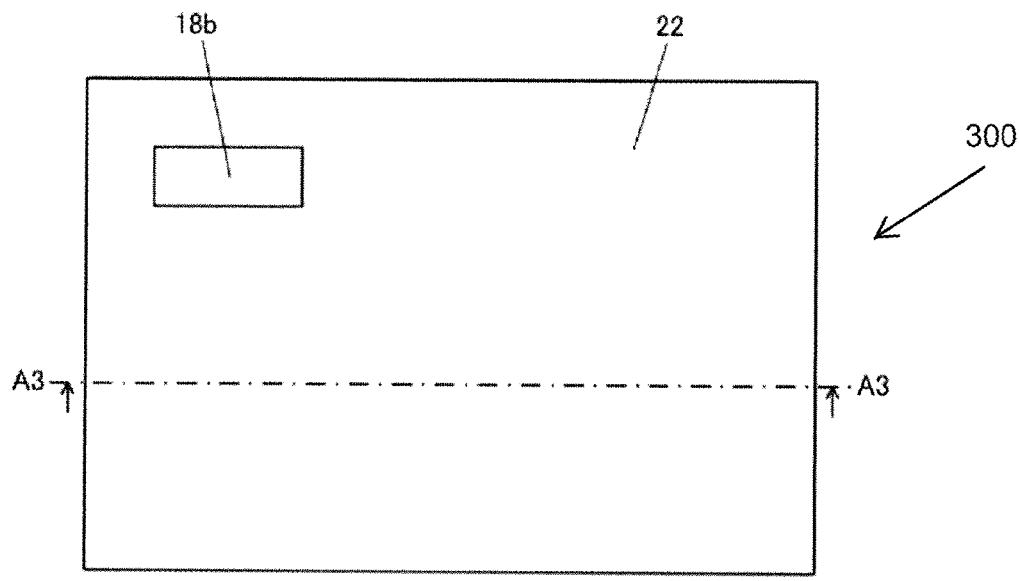
FIG. 5A is a top view illustrating a circuit module according to a third embodiment and FIG. 5B is an end view taken along A3-A3 of FIG. 5A.
Figure 5B:
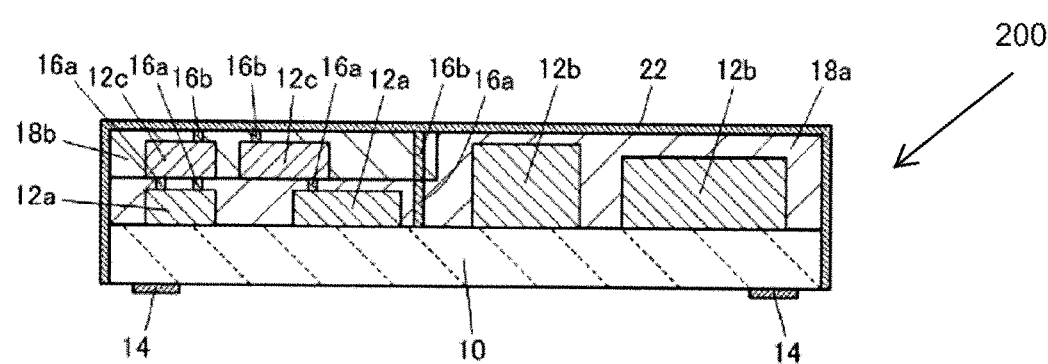
Figure 6A:
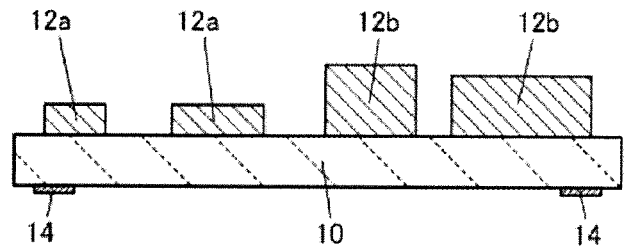
FIGS. 6A to 6F illustrate a first half of a manufacturing process of the circuit module according to the third embodiment.

The configuration of a circuit module 300 which is a third embodiment of the circuit module according to the present disclosure is described with reference to FIGS. 5A and 5B, FIGS. 6A to 6F, and FIGS. 7A and 7B. FIG. 5A is a top view illustrating the circuit module 300 which is the third embodiment of the circuit module according to the present disclosure and FIG. 5B is an end view taken along A3-A3 of FIG. 5A. FIGS. 6A to 6F illustrate the first half of a manufacturing process of the circuit module 300 which is the third embodiment of the circuit module according to the present disclosure. FIGS. 7A and 7B illustrate the second half of the manufacturing process of the circuit module 300 which is the third embodiment of the circuit module according to the present disclosure.

A substrate 10 is first prepared. The substrate 10 is provided with a wiring pattern (not shown) on one major surface thereof and includes internal wiring (not shown) thereinside. The wiring pattern is connected with external terminals 14 formed on the other major surface of the substrate 10 with the internal wiring of the substrate 10 interposed therebetween. Subsequently, the electronic components 12a and the electronic components 12b are mounted on the one major surface of the substrate 10 (FIG. 6A).

Figure 6B:
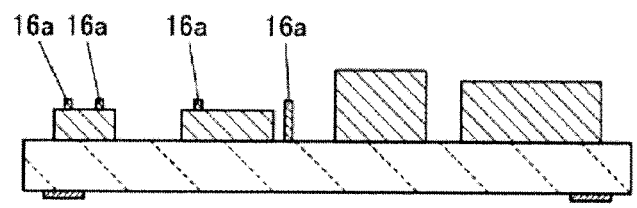
Figure 7A:
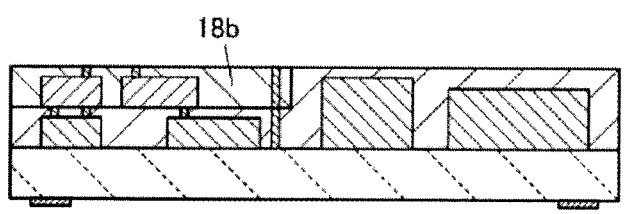
FIGS. 7A and 7B illustrate a second half of the manufacturing process of the circuit module according to the third embodiment.
Figure 7B:
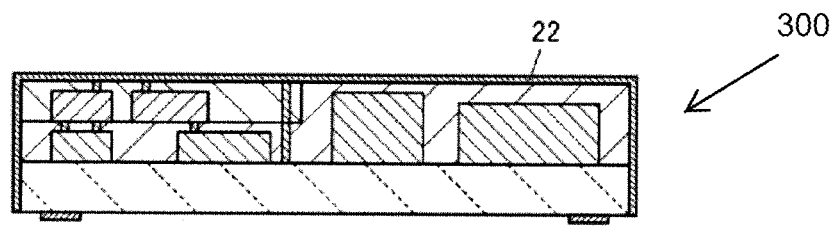
Figure 8:
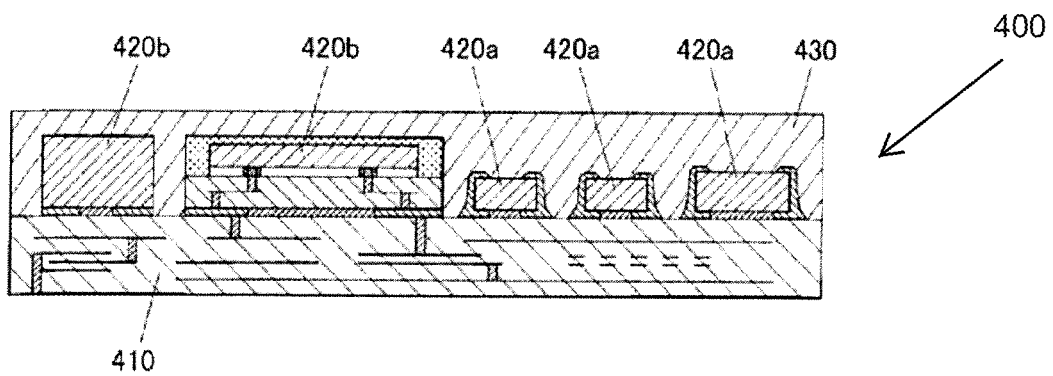
FIG. 8 is a sectional view illustrating a circuit module of the related art.

Subsequently, posts 16a are formed on the wiring pattern and electrodes of the electronic components 12a in the first region and are electrically connected with the wiring pattern (FIG. 6B). The post 16a formed on the wiring pattern in the first region is taller than the electronic component 12a in height. The height obtained by adding the height of the post 16a formed on the electrode of the electronic component 12a to the height of the electronic component 12a is substantially the same as the height of the post 16a formed on the wiring pattern in the first region.

Figure 6C:
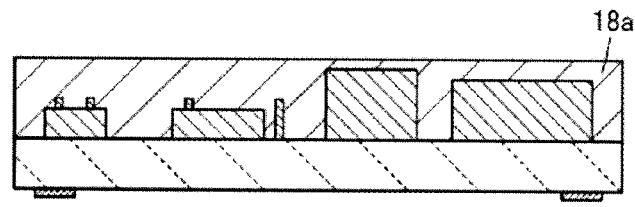

Next, after the electronic components 12a, the electronic components 12b, and the posts 16a are sealed with sealing resin 18a, the whole is polished in accordance with the height of the electronic components 12b (FIG. 6C).

Figure 6D:
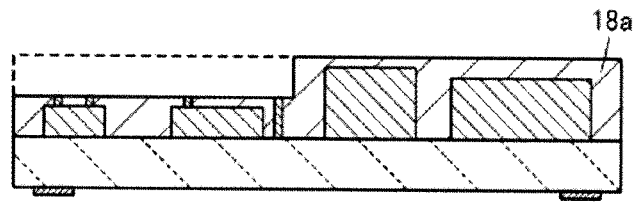

Subsequently, the sealing resin 18a sealing the first region is polished so that the sealing resin 18a sealing the first region becomes shorter than the sealing resin 18a sealing the second region in height and thus end faces of the posts 16a are exposed. Wiring 20 is formed on the surface of the sealing resin 18a sealing the first region and the posts 16a are electrically connected with the wiring 20 (FIG. 6D). Part of the wiring 20 may be used as a power feeding electrode which excites a slot, but the wiring 20 is not limited to this.

Figure 6E:
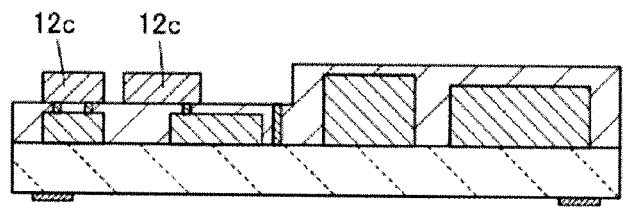

Subsequently, the electronic components 12c are mounted on the surface of the sealing resin 18a sealing the first region and the electronic components 12c are electrically connected with the wiring 20 (FIG. 6E). The height obtained by including the height of the sealing resin 18a sealing the first region, the height of the wiring 20, and the height of the electronic component 12c is lower than the surface of the sealing resin 18a sealing the second region.

Figure 6F:
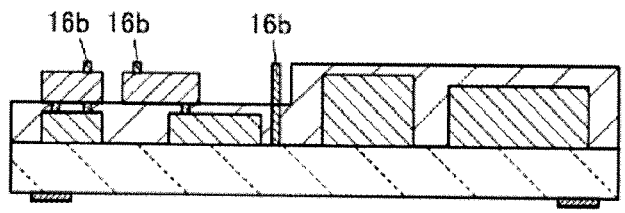

Subsequently, posts 16b are formed on the wiring 20 and electrodes of the electronic components 12c and the posts 16b are electrically connected with the wiring 20 (FIG. 6F). The height of the post 16b formed on the wiring 20, that is obtained by adding the height of the sealing resin 18a sealing the first region and the height of the wiring 20, is higher than the surface of the sealing resin 18a sealing the second region. The height obtained by adding the height of the post 16b formed on the electrode of the electronic component 12c to the height of the electronic component 12c is substantially the same as the height of the post 16b formed on the wiring 20.

Next, after the electronic components 12c, the posts 16b, and the wiring 20 are sealed with sealing resin 18b, the sealing resin 18b is polished in accordance with the surface of the sealing resin 18a sealing the second region so as to expose the end faces of the posts 16b (FIG. 7A). In the polishing, the surface of the sealing resin 18b and the surface of the sealing resin 18a may be polished at the same time. Further, as is the case with the circuit module 200 which is the second embodiment of the circuit module according to the present disclosure, after the electronic components 12c, the posts 16b, the wiring 20, and the surface of the sealing resin 18a sealing the second region are sealed with the sealing resin 18b, the surface of the sealing resin 18b may be polished.

Subsequently, a conductive film 22 is formed on side surfaces of the sealing resin 18a, the sealing resin 18b, and the substrate 10, the surface of the sealing resin 18a sealing the second region, and the surface, excluding a part thereof, of the sealing resin 18b and the conductive film 22 is electrically connected with a ground potential of the substrate 10 at the side surfaces of the substrate 10 (FIGS. 5A and 5B and FIG. 7B). That is, the conductive film 22 is used as a shield of the circuit module 300. Here, the conductive film is not formed in the upper left in the top view of the circuit module 300 in FIG. 5A and the sealing resin 18b is seen in a rectangular shape. This part is a cavity for a slot antenna. Under the cavity for the slot antenna, a power feeding electrode for exciting a slot is disposed (not shown). Here, the shape of the cavity for the slot antenna is not limited to the rectangular shape. Any shape such as a circular shape, an elliptical shape, and a polygonal shape may be employed for the shape of the cavity for the slot antenna.

Thus, the circuit module 300 is formed to have the planar and even surface with the conductive film 22 except for the cavity. Accordingly, the circuit module 300 is easily gripped and mounted when being mounted on a substrate of an electronic device and the circuit module 300 has a good appearance as well. Further, a shield can be formed by the conductive film 22 connected with the ground potential of the substrate 10, suppressing noise radiation from the electronic components 12a, the electronic components 12b, or the electronic components 12c or an influence of external noise. Ground wiring of the electronic components 12c can be connected with the conductive film 22 serving as a shield in short connection, and ground impedance is accordingly lowered, improving high frequency circuit characteristics and suppressing noise generation. Further, an antenna can be formed on a part which is not grounded.

The embodiments of the present disclosure have been described above. However, the present disclosure is not limited to these specific embodiments but various modifications and alterations may be made within a scope of the gist of the present disclosure described in the claims.

100, 200, 300, 400 circuit module, 12a, 12b, 12c electronic component, 14 external terminal, 16a, 16b post, 18a, 18b sealing resin, 20 wiring, 22 conductive film

The invention claimed is:

1. A circuit module comprising:
   a substrate provided with a wiring pattern;
   a first region on one major surface of the substrate, wherein a first electronic component is mounted on the first region;
   a second region on the one major surface of the substrate, wherein a second electronic component is mounted on the second region, and the second electronic component is taller than the first electronic component in height;
   one or more first conductors provided in the first region and electrically connected with the wiring pattern; and
   a sealing resin sealing the first electronic component, the second electronic component, and the first conductors; wherein
   one portion of the sealing resin sealing the first region is provided to be shorter than another portion of the sealing resin sealing the second region in height,
   a part of each of the first conductors is exposed on a surface of the one portion of the sealing resin sealing the first region,
   a wiring is provided on the surface of the one portion of the sealing resin sealing the first region, and
   the part of each of the first conductors exposed is electrically connected with the wiring on the surface of the one portion of the sealing resin.

2. The circuit module according to claim 1, wherein
   a third electronic component is mounted on the surface of the one portion of the sealing resin sealing the first region, and
   the third electronic component is electrically connected with each of the first conductors having the part exposed.

3. The circuit module according to claim 1, wherein at least one of the first conductors is provided on an electrode of the first electronic component.

4. The circuit module according to claim 2, further comprising:
   an additional sealing resin sealing the wiring on the surface of the one portion of the sealing resin and the third electronic component.

5. The circuit module according to claim 4, wherein the additional sealing resin also seals a surface of the other portion of the sealing resin sealing the second region.

6. The circuit module according to claim 4, wherein a conductive film electrically connected with a ground potential of the substrate is provided on side surfaces of the substrate, the sealing resin, and the additional sealing resin and a surface of the additional sealing resin or the surface of the one portion of the sealing resin and the surface of the additional sealing resin.

7. The circuit module according to claim 6, further comprising
   one or more second conductors provided on an electrode of the third electronic component or on the wiring on the surface of the one portion of the sealing resin, wherein
   the second conductor is sealed with the additional sealing resin,
   a part of each of the second conductors is exposed on the surface of the additional sealing resin, and
   each of the second conductors having the part exposed is electrically connected with the conductive film.

8. The circuit module according to claim 1, wherein each of the first conductors comprises a sintered metal in a columnar shape.

9. The circuit module according to claim 7, wherein each of the first conductors or each of the second conductors comprises a sintered metal in a columnar shape.

10. The circuit module according to claim 2, wherein at least one of the first conductors is provided on an electrode of the first electronic component.

11. The circuit module according to claim 5, wherein a conductive film electrically connected with a ground potential of the substrate is provided on side surfaces of the substrate, the sealing resin, and the additional sealing resin and a surface of the additional sealing resin or the surface of the one portion of the sealing resin and the surface of the additional sealing resin.

12. The circuit module according to claim 2, wherein each of the first conductors comprises a sintered metal in a columnar shape.

13. The circuit module according to claim 3, wherein each of the first conductors comprises a sintered metal in a columnar shape.

14. The circuit module according to claim 4, wherein each of the first conductors comprises a sintered metal in a columnar shape.

15. The circuit module according to claim 5, wherein each of the first conductors comprises a sintered metal in a columnar shape.

16. The circuit module according to claim 6, wherein each of the first conductors comprises a sintered metal in a columnar shape.

17. The circuit module according to claim 1, wherein the part of each of the first conductors exposed on a top surface of the one portion of the sealing resin and the wiring are provided on the top surface of the one portion of the sealing resin sealing.

18. The circuit module according to claim 1, further comprising a third electronic component that is mounted on the surface of the sealing resin, wherein the wiring is electrically connected to the third electronic component.

19. The circuit module according to claim 18, wherein the wiring includes at least either of a power feeding electrode or a radiation electrode of an antenna.

* * * * *